(12) United States Patent
Sanroma Garrit et al.

(10) Patent No.: US 11,597,155 B2
(45) Date of Patent: *Mar. 7, 2023

(54) DIMENSIONAL COMPENSATIONS FOR ADDITIVE MANUFACTURING

(71) Applicant: Hewlett-Packard Development Company, L.P., Spring, TX (US)

(72) Inventors: Jordi Sanroma Garrit, Sant Cugat del Valles (ES); Enrique Gurdiel Gonzalez, Sant Cugat del Valles (ES); Victor Diego Gutierrez, Sant Cugat del Valles (ES); Manuel Freire Garcia, Sant Cugat del Valles (ES)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/199,375

(22) Filed: Mar. 11, 2021

(65) Prior Publication Data

US 2021/0197492 A1 Jul. 1, 2021

Related U.S. Application Data

(63) Continuation of application No. 16/246,046, filed on Jan. 11, 2019, now Pat. No. 10,974,458.

(51) Int. Cl.
| | |
|---|---|
| *B29C 64/393* | (2017.01) |
| *G06F 30/00* | (2020.01) |
| *B33Y 30/00* | (2015.01) |
| *B33Y 50/02* | (2015.01) |
| *B33Y 10/00* | (2015.01) |

(52) U.S. Cl.
CPC .......... *B29C 64/393* (2017.08); *G06F 30/00* (2020.01); *B33Y 10/00* (2014.12); *B33Y 30/00* (2014.12); *B33Y 50/02* (2014.12)

(58) Field of Classification Search
CPC ....... B29C 64/393; G06F 30/00; B33Y 10/00; B33Y 30/00; B33Y 50/02
See application file for complete search history.

(56) References Cited

U.S. PATENT DOCUMENTS

| | | | |
|---|---|---|---|
| 2013/0073068 | A1 | 3/2013 | Napadensky |
| 2015/0154321 | A1 | 6/2015 | Schmidt et al. |

(Continued)

FOREIGN PATENT DOCUMENTS

| | | |
|---|---|---|
| CN | 105598450 | 5/2016 |
| CN | 105313336 | 7/2017 |

(Continued)

*Primary Examiner* — Michael W Choi
(74) *Attorney, Agent, or Firm* — Michael Dryja

(57) ABSTRACT

In an example, a method includes receiving, at least one processor, object model data representing at least a portion of an object that is to be generated by an additive manufacturing apparatus by fusing build material within a fabrication chamber. An intended object placement location within the fabrication chamber may be determined, and a dimensional compensation to apply to the object model data may be determined using a mapping resource relating dimensional compensations to object placement locations. The determined dimensional compensation may be applied to the object model data to generate modified object model data using at least one processor.

11 Claims, 5 Drawing Sheets

(56) References Cited

U.S. PATENT DOCUMENTS

| | | | |
|---|---|---|---|
| 2016/0354980 A1 | 12/2016 | Ho et al. | |
| 2017/0310935 A1 | 10/2017 | Sinclair | |
| 2017/0372480 A1 | 12/2017 | Anand et al. | |
| 2018/0099454 A1* | 4/2018 | Hummeler | B33Y 10/00 |
| 2018/0141286 A1 | 5/2018 | Davis | |
| 2018/0307209 A1 | 10/2018 | Chin et al. | |
| 2020/0009769 A1* | 1/2020 | Achten | B33Y 70/00 |

FOREIGN PATENT DOCUMENTS

| | | |
|---|---|---|
| CN | 107145928 | 9/2017 |
| EP | 3205483 B1 | 8/2017 |
| WO | WO-2016121120 | 8/2016 |
| WO | WO-2017019100 A1 | 2/2017 |
| WO | WO-2017099804 A1 | 6/2017 |

* cited by examiner

DIMENSIONAL COMPENSATIONS FOR ADDITIVE MANUFACTURING

CROSS REFERENCE TO RELATED APPLICATIONS

This application is a continuation of U.S. application Ser. No. 16/246,046, filed Jan. 11, 2019. The contents of U.S. application Ser. No. 16/246,046 are incorporated herein by reference in their entirety.

BACKGROUND

Additive manufacturing techniques may generate a three-dimensional object through the solidification of a build material, for example on a layer-by-layer basis. In examples of such techniques, build material may be supplied in a layer-wise manner and the solidification method may include heating the layers of build material to cause melting in selected regions. In other techniques, chemical solidification methods may be used.

BRIEF DESCRIPTION OF DRAWINGS

Non-limiting examples will now be described with reference to the accompanying drawings, in which.

DETAILED DESCRIPTION

Figure 1:
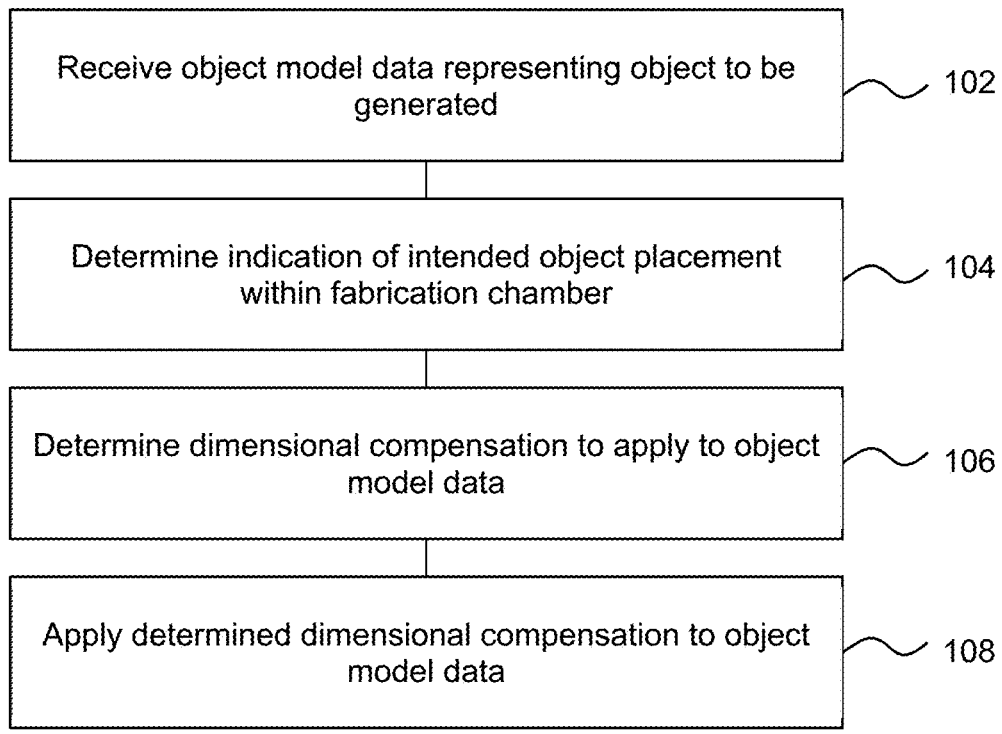
FIG. 1 is a flowchart of an example method of modifying object model data.

Additive manufacturing techniques may generate a three-dimensional object through the solidification of a build material. In some examples, the build material is a powder-like granular material, which may for example be a plastic, ceramic or metal powder and the properties of generated objects may depend on the type of build material and the type of solidification mechanism used. In some examples the powder may be formed from, or may include, short fibres that may, for example, have been cut into short lengths from long strands or threads of material. Build material may be deposited, for example on a print bed and processed layer by layer, for example within a fabrication chamber. According to one example, a suitable build material may be PA12 build material commercially referred to as V1R10A "HP PA12" available from HP Inc.

In some examples, selective solidification is achieved using heat, for example through directional application of energy, for example using a laser or electron beam which results in solidification of build material where the directional energy is applied.

In other examples, at least one print agent may be selectively applied to the build material, and may be liquid when applied. For example, a fusing agent (also termed a 'coalescence agent' or 'coalescing agent') may be selectively distributed onto portions of a layer of build material in a pattern derived from data representing a slice of a three-dimensional object to be generated (which may for example be generated from structural design data). The fusing agent may have a composition which absorbs energy such that, when energy (for example, heat) is applied to the layer, the build material heats up, coalesces and solidifies upon cooling, to form a slice of the three-dimensional object in accordance with the pattern. In other examples, coalescence may be achieved in some other manner.

According to one example, a suitable fusing agent may be an ink-type formulation comprising carbon black, such as, for example, the fusing agent formulation commercially referred to as V1Q60A "HP fusing agent" available from HP Inc. In one example such a fusing agent may comprise an infra-red light absorber. In one example such a fusing agent may comprise a near infra-red light absorber. In one example such a fusing agent may comprise a visible light absorber. In one example such a fusing agent may comprise a UV light absorber. Examples of print agents comprising visible light enhancers are dye based colored ink and pigment based colored ink, such as inks commercially referred to as CE039A and CE042A available from HP Inc.

In addition to a fusing agent, in some examples, a print agent may comprise a coalescence modifier agent, which acts to modify the effects of a fusing agent for example by reducing or increasing coalescence or to assist in producing a particular finish or appearance to an object, and such agents may therefore be termed detailing agents. In some examples, detailing agent may be used near edge surfaces of an object being printed. According to one example, a suitable detailing agent may be a formulation commercially referred to as V1Q61A "HP detailing agent" available from HP Inc. A coloring agent, for example comprising a dye or colorant, may in some examples be used as a fusing agent or a coalescence modifier agent, and/or as a print agent to provide a particular color for the object.

As noted above, additive manufacturing systems may generate objects based on structural design data. This may involve a designer generating a three-dimensional model of an object to be generated, for example using a computer aided design (CAD) application. The model may define the solid portions of the object. To generate a three-dimensional object from the model using an additive manufacturing system, the model data can be processed to generate slices of parallel planes of the model. Each slice may define a portion of a respective layer of build material that is to be solidified or caused to coalesce by the additive manufacturing system.

FIG. 1 is an example of a method, which may comprise a computer implemented method of modifying object model data.

The method comprises, in block 102, receiving, at at least one processor, object model data representing at least a portion of an object that is to be generated by an additive manufacturing apparatus by fusing build material within a fabrication chamber. In some examples, the fusing process may comprise a thermal fusing processing in which heat is applied.

The object represented by the object model data is to be generated by an additive manufacturing apparatus by fusing build material. The object model may comprise data representing at least a portion (in some examples, a slice) of an object to be generated by an additive manufacturing apparatus by fusing a build material. The object model data may for example comprise a Computer Aided Design (CAD) model, and/or may for example be a STereoLithographic (STL) data file. In some examples, the object model data may represent the object or object portion as a plurality of sub-volumes, wherein each sub-volume represents a region of the object which is individually addressable in object generation. In some examples herein, the sub-volumes may be referred to as voxels, i.e. three-dimensional pixels.

The method further comprises in block 104, determining, using at least one processor, an indication of an intended object placement within the fabrication chamber. For example, this may be determined based on a coordinate system. For example, a corner of the fabrication chamber may be designated as the origin and X, Y and Z offsets may be used to specify a location of an object. The location of the object when generated may be characterised as an indicative point location. For example, the location may be characterised as the coordinates of the center of mass of the object when generated, or the volumetric center of the object. In other examples, the indication may comprise an indication of the point on the object which is the closest to the origin in each axis, or may be defined by reference to an enclosing volume (e.g. a center or a corner of a bounding box enclosing the object), or in some other way. The location may be a location in at least one direction dimension, for example at least one of the X, Y or Z axis, and may in some examples comprise an xyz coordinate (although in other example, indication of the intended object placement may be a specification of a position in one or two axes, rather than all three axes, may be provided).

Block 106 comprises determining, using at least one processor, a dimensional compensation to apply to the object model data, wherein the dimensional compensation is determined using a mapping resource relating dimensional compensations to object placement locations within a fabrication chamber.

Dimensional compensation may be used to compensate for anticipated departures from intended dimensions when generating an object. For example, it may be the case that when an object is generated in a process which includes heat, additional build material may adhere to the object on generation. To consider a slice or layer of an object, in an example, print agent may be applied (and/or control instructions may be specified) with a resolution of around 600 dpi (dots per inch) or 1200 dpi. In other examples, other resolutions may be used for control instructions and/or print agent application. A resolution of 600 dpi may, in some examples, allow a uniquely addressable region of 42 by 42 microns in cross section, and thus voxels may be defined to relate to a 42 by 42 micron region. Print agent may be associated with a group of voxels, which in turn correspond to regions of the layer. However, when fusing agent has been applied and energy is supplied, build material of neighbouring regions/voxels may become heated and fuse to the outside of the object (in some examples, being fully or partially melted, or adhering to melted build material as powder). Therefore, a dimension of an object(s) may be larger than the regions to which fusing agent is applied. In order to compensate for the fact that objects may tend to 'grow' during manufacture in this manner, the object volume as described in object model data may be reduced.

In other examples, objects may be smaller following object generation than is specified when printed. For example, some build materials used to generate objects may shrink on cooling.

While in some examples the dimensional compensation to apply maybe determined for example based on an analysis of thermal and/or material considerations and the like, according to the method of FIG. 1, the dimensional compensation is determined by use of a mapping resource relating dimensional compensations to intended object placement locations. It has been noted that dimensional accuracy may be significantly improved by considering this location alone (although in some examples, the method may be used in combination with other techniques to further increase dimensional accuracy).

In some examples, the dimensional compensation may comprise a parametrical transformation, for example a geometrical and/or dimensional transformation such as at least one of an offset and a scaling factor. In one example, a dimensional compensation may indicate three scaling factors (one for each of the three orthogonal dimensions) and three offset factors (one for each of the three orthogonal dimensions). A scaling factor may be used to multiply all specified dimensions in direction of the first axis by a value, which may be greater than 1 in order to increase the dimensions and less than 1 to reduce the dimensions. An offset factor may specify, for example by a specified distance or a number of voxels, an amount to add or remove from a surface of the object (or a perimeter within a layer). For example, a distance as measured in the direction of a normal from the object surface may be specified and the object may be eroded or dilated (i.e., inflated or enlarged) by this distance.

The dimensional compensation may for example be applied to a mesh or vector, or voxel model of the object, or to a model of the object defined in some other way.

In some examples, where scaling is not indicated in a given dimension, the scaling factor in relation to that dimension may be set to 1, and if no offset is indicated in a given dimension, the offset factor in relation to that dimension may be set to 0. In some examples, each of these factors may be stored in a different mapping resource, while in other examples a plurality of factors may be specified in the same mapping resource.

As will be set out in greater detail below, in some examples, the mapping resource could comprise a plurality of values which relate to dispersed locations within a fabrication chamber, for example comparable to nodes of a three-dimensional grid of locations within a fabrication chamber. In some examples, the value which relates to the location closest to the location provided by the indication of an intended object placement may be selected. However, in other examples, a compensation to apply may be interpolated as being between such values, for example by determining a weighted average or the like.

In some examples, the predetermined mapping resource may be derived from an inference model, which may be generated using a training dataset derived from objects previously generated using additive manufacturing.

Block 108 comprises applying, using at least one processor, the determined dimensional compensation to the object model data to determine modified object model data. In some examples, where the object model data is described in terms of sub-volumes, such sub-volumes may be added or removed (or eroded). Where the object is, for example, described by a mesh model or the like, the mesh model may be adjusted, expanded or contracted as set out by the determined dimensional compensation.

In one example, the dimensional compensation may indicate three scaling factors (one for each of the three orthogonal dimensions) and three offset factors (one for each of the three orthogonal dimensions). As noted above, if scaling is not indicated in a given dimension, the scaling factor in relation to that dimension may be set to 1, and if no offset is indicated in a given dimension, the offset factor in relation to that dimension may be set to 0.

Figure 2A:
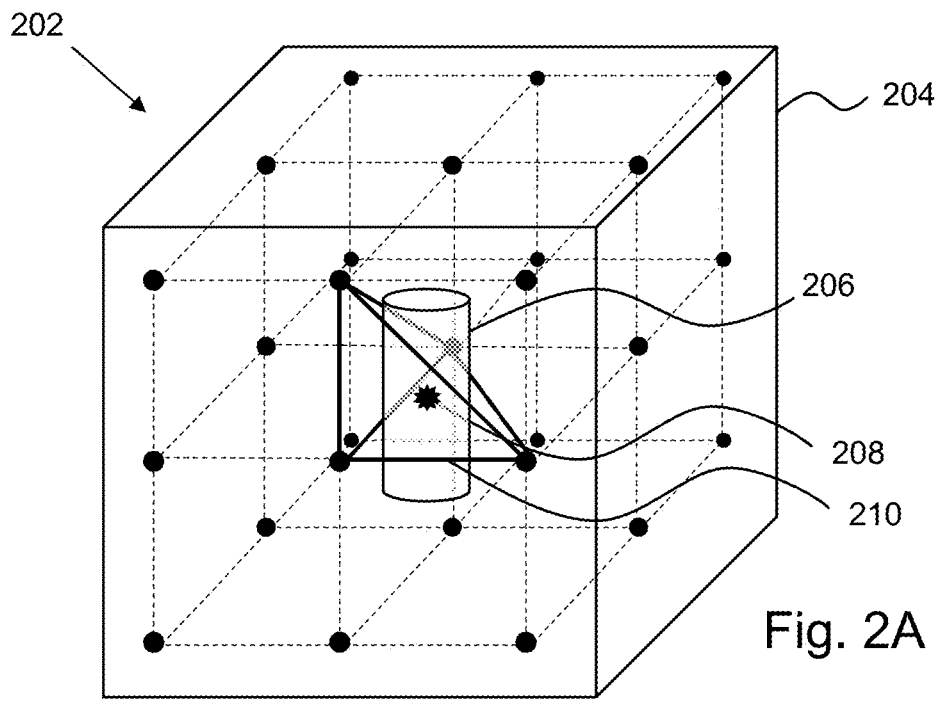
FIGS. 2A and 2B show visualisations of example mapping resources.

FIG. 2A is a representation of a first example a mapping resource 202 comprising a plurality of nodes shown as circles, where each node is associated with location within a virtual fabrication chamber 204, which models a real fabrication chamber, and is further associated with a particular dimensional compensation (for example, a scaling factor in Y, or an offset in Z). In this example, a 3 by 3 by 3 grid of nodes is provided. The nodes in this case are evenly distributed in all dimensions, although this need not be the case in all examples. Each node represents a value for a dimensional compensation.

An object, in this example a cylinder 206 is to be generated in the fabrication chamber, and the center 208 (in this example, defined as the center of mass of the object 206 is marked). The center 208 can be enclosed by a tetrahedron 210 with its four vertices formed by nodes of the grid. Therefore, in this example, the values of these four vertices/nodes are used to interpolate a value to be used as a dimensional compensation for the object. For example, this may comprise determining a weighted average of the values associated with the locations of the vertices/nodes, wherein the weighting depends on the distance of each vertex from the center 208, with closer vertices being given greater weighting. This may be termed 'barycentric tetrahedral interpolation'.

In the event that the center 208 coincides with a location of a node, the value of that node may be adopted as the value of the dimensional compensation.

In this way, an effectively continuous mapping between the dimensional companions to the coordinate space of a build volume may be provided. The error associated with interpolation may be reduced by increasing the number of points and reducing the spacing there between.

In one practical example, fixed spacing may be used in the grid, which may be arranged such that the whole build volume is substantially covered, and the grid is centered between the limits.

For example, the number of nodes in each axis may be calculated as the ratio between each dimension and the node spacing, rounded up to the next integer number if not integer, and by adding one. Considering a particular example with xyz coordinates, the spacing between the nodes of the grid to may be set to 50 mm for a fabrication chamber with printable dimensions of 250 mm×165 mm×110 mm, with an origin of coordinates defined as (0,0,0), In such an example, the number of nodes in each axis may be determined as follows:

$$250/50=5 \rightarrow 5+1=6 \quad \text{x)}$$

$$165/50=3.3 \rightarrow 4+1=5 \quad \text{y)}$$

$$110/50=2.2 \rightarrow 3+1=4 \quad \text{z)}$$

The nodes may be set such that the printable space is centered between the first and the last values in each dimension. The range of the nodes in each dimension is the product of the number of nodes minus one by the spacing value. To continue the example above, the range of the nodes in each dimension is as follows:

$$50*5=250 \text{ mm} \quad \text{x)}$$

$$50*4=200 \text{ mm} \quad \text{y)}$$

$$50*3=150 \text{ mm} \quad \text{z)}$$

The minimum node may be set to be the origin of coordinates minus half of the difference between the range of the nodes and the printable range. To continue the example above, the placement of the minimum node in xyz coordinates may be determined as follows:

$$0-0.5*(250-250)=0 \quad \text{x)}$$

$$0-0.5*(200-165)=-17.5 \quad \text{y)}$$

$$0-0.5*(150-110)=-20 \quad \text{z)}$$

This means that the minimum node in this example relates to the x,y,z position within the fabrication chamber of (0, −17.5, −20)

The rest of the nodes coordinates are given by the translations of the minimum node in each dimension using the spacing an integer amount of times. The allowed coordinate values by axis in the example are therefore positioned as follows:

$$\{0,50,100,150,200,250\} \quad \text{x)}$$

$$\{-17.5,32.5,82.5,132.5,182.5\} \quad \text{y)}$$

$$\{-20,30,80,130\} \quad \text{z)}$$

All the coordinates of the nodes of grid in this example are given by the possible combinations of the coordinates by axis, in this case there would be 6*5*4=120 nodes in total.

In other examples, the spacing value of the grid can be different in each dimension. This may for example be appropriate if a dimensional compensation is more variable in one dimension than in another.

In some examples the grid may vary over the virtual fabrication chamber. In some examples, the spacing of nodes may vary according to the variability of the values, such that more values/nodes are stated or defined when the rate of change of the node to node values is higher than when it is lower. For example, there may be more nodes (i.e. the nodes may have a closer spacing) towards the edges of the fabrication chamber than in a center. This could for example reflect that such regions tend to be associated with higher thermal gradients. However, providing a regular grid in which the nodes are located in straight lines in each direction forming rectangular parallelepipeds) has an advantage in that it is relatively simple of identifying the vertices of the tetrahedron for interpolation as described above.

In addition, the methodology can be extended to coordinates that do not represent spatial dimensions, like a volume or a surface of the part being printed. In those cases, an appropriate range and spacing for those dimensions may be set.

For example, it may be determined that the dependency of the scaling factors is strongly related to a vertical coordinate (e.g. a z height) and a measure of the mean wall thickness defined as volume divided by surface. A two dimensional grid may be defined, wherein the bounds of the mean wall thickness axis are defined by the minimum and maximum mean wall thicknesses used to determine the relationship (for example, the minimum and maximum mean wall thicknesses used to generate a training dataset, as will be further discussed below), and the spacing of the nodes may be determined based on, for example the rate of change of the dependency as set out above. Any mean wall thickness values which are outside the minimum-maximum node range may be taken to have a value equal to that of the minimum or the maximum node as appropriate.

In another example, there may be additional descriptors used to determine a dimensional compensation in a model in which an xyz dependence is also determined. Again, the bounds of such additional descriptors (for example, mean wall thickness, object volume, or some other object property, or an operational parameter of the additive manufacturing apparatus) may be determined and sampled to define nodes. In some examples, interpolating in such examples may comprise a generalization of the tetrahedral interpolation in a higher number of dimensions. In other examples, a 3D tetrahedral interpolation within three coordinates (which could be the dimensional coordinates, but in principle could be any three descriptors) but, rather than being associated with a value, each node of the grid may be associated with a vector with scaling factors (or a matrix) for each node sampled of the remaining coordinates.

For example, the value of each vector may be determined or interpolated based on a known object feature/position, and a tetrahedral interpolation may be applied to these values.

In other words, interpolation may be generalised to a higher number of dimensions in any of a number of ways. Interpolation may also be carried out in one or two dimensions using similar principles to those discussed above.

Figure 2B:
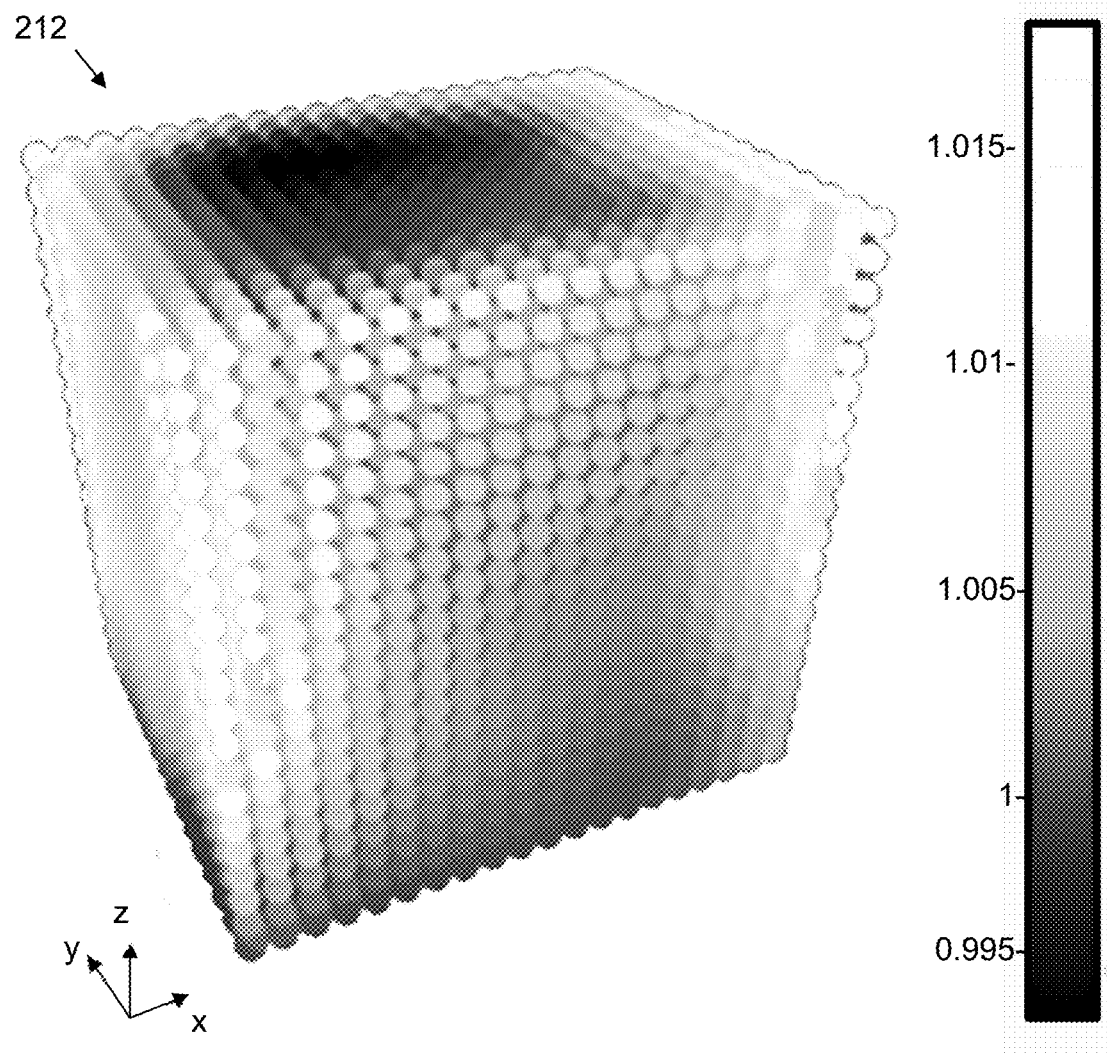

FIG. 2B shows an example visualization of a mapping resource 212 of scaling factors to apply in the Z dimension, wherein the scaling factors are associated with an xyz position within a fabrication chamber shown as a sphere representing a node. The value of each node is represented on a color scale and in this example is a vertical scaling factor (i.e. resulting in a change of the height of the object in the orientation in which it is generated). The scaling factor is greater than one where a virtual object is to be enlarged and less than one where a virtual object is to be reduced in size. Corresponding models may be created for scaling factors to apply in other dimensions (i.e. to change a width or a depth of an object in the orientation in which it is generated) each dimension and/or for each of a scaling factor and an offset factor.

Figure 3:
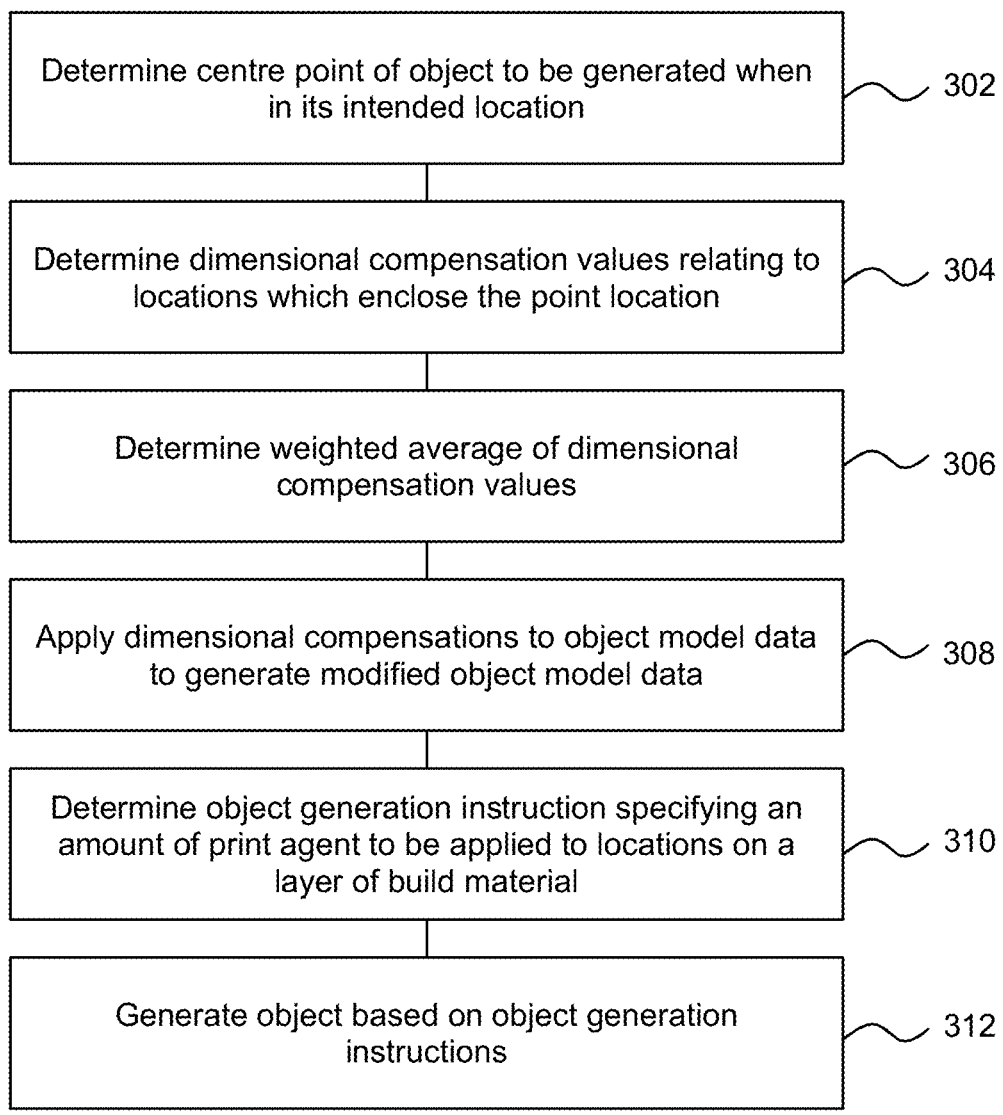
FIG. 3 shows an example method of object generation.

FIG. 3 is an example method of object generation, comprising, in block 302, determining a centre point of an object to be generated in additive manufacturing when the object is in its intended locations within a fabrication chamber. This may comprise generating a virtual fabrication chamber, in which one or a plurality of virtual objects are arranged in the position which it is intended that the objects would occupy on generation. In this example, the centre location is a centre of mass of the object, but in another example, it may be some other location, for example the centre of a bounding box, i.e. the smallest cuboid which can fully enclose the object. In another example, a different location may be used, for example the lowermost coordinate, or any other predetermined coordinate.

Block 304 comprises determining, from a mapping resource, a plurality of dimensional compensation values relating to locations which enclose the point location. In this example, the dimensional compensation values comprise three scaling factors and three offset factors, where in each of the scaling factors and each of the offset factors is associated with one of three orthogonal axes. In some examples, the mapping resource may comprise a plurality of 3D look-up tables, each relating to a different dimensional compensation (e.g. a different axis and/or one of offset and scale). The nominal spatial distribution of values within the different look-up tables may be different. In other examples, there may be a combined resource, for example with nodes which are associated with a plurality of values relating to the different axes for offsets and/or scale.

Block 306 comprises determining a weighted average of the plurality of dimensional compensation values. As noted above, the weighting may be based on the distance between the location indicative of the object placement (in this example, the object centre) and the node.

Block 308 comprise applying, using at least one processor, the determined dimensional compensations to the object model data to generate modified object model data. This therefore changes the model data to include scale and/or offset factor where applicable in each dimension. The scale and/or offset factor may be applied to a mesh model of the object or to a voxel model of the object.

Block 310 comprises determining object generation instructions (or 'print instructions') for generating the object. The object generation instruction in some examples may specify an amount of print agent to be applied to each of a plurality of locations on a layer of build material. For example, generating object generation instructions may comprise determining 'slices' of the selected virtual build volume, and rasterising these slices into pixels (or voxels, i.e. three-dimensional pixels). An amount of print agent (or no print agent) may be associated with each of the pixels/voxels. For example, if a pixel relates to a region of a build volume which is intended to solidify, the object generation instructions may be generated to specify that fusing agent should be applied to a corresponding region of build material in object generation. If however a pixel relates to a region of the build volume which is intended to remain unsolidified, then object generation instructions may be generated to specify that no agent, or a coalescence modifying agent such as a detailing agent, may be applied thereto. In addition, the amounts of such agents may be specified in the generated instructions and these amounts may be determined based on, for example, thermal considerations and the like.

Block 312 comprises generating an object based on the object generation instructions. For example, such an object may be generated layer by layer. For example, this may comprise forming a layer of build material, applying print agents, for example through use of 'inkjet' liquid distribution technologies in locations specified in the object generation instructions for an object model slice corresponding to that layer using at least one print agent applicator, and applying energy, for example heat, to the layer. Some techniques allow for accurate placement of print agent on a build material, for example by using printheads operated according to inkjet principles of two dimensional printing to apply print agents, which in some examples may be controlled to apply print agents with a resolution of around 600 dpi, or 1200 dpi. A further layer of build material may then be formed and the process repeated, for example with the object generation instructions for the next slice.

In this way, the object once formed may end up being closer to an intended size.

While in this example, the modification to the data was made before object generation instructions were determined, this need not be the case in all examples, and in other examples object generation instructions may be generated.

In some examples, the methods set out herein may be combined with other methods of object model modification. For example, a modification function may be employed in the vicinity, or locality, of small features. An erosion of such small features may result in an unacceptable reduction in their size, either obliterating the feature or rendering it too small to fuse or too delicate to survive cleaning operations. For example, if a feature has a dimension of around 0.5 mm, this may correspond to 12 voxels at 600 dpi. If three or four voxels are eroded from the side of such a small feature, it will lose approximately 50 to 60% of its cross-section, reducing its size to less than 0.3 mm. Such a feature may be too small to survive cleaning operations. Thus, in some examples, other functions may be used to ensure that small features are preserved.

As briefly mentioned above, in one example, the mapping resource(s) may comprise or be based on an inference model generated a training dataset for an inference model to generate dimensional modifications to apply to object models to compensate for departures from model dimensions in objects generated using additive manufacturing based on those models. A 'training dataset' in this context is a set of data which is processed to allow an inference model to be 'learnt'. A relationship between dimensional inaccuracies and the placement of an object in a fabrication chamber may be inferred from the training set and used to build the inference model. This in turn may be used to provide a mapping resource, for example with explicitly defined values in a look-up table relating to a 3D space as described above.

For example, this may make use of data gathered from a set of objects generated using an additive manufacturing process. In some examples, these may be generated using the same class of additive manufacturing process (for example, all the objects may be generated using selective laser sintering, or all the objects may be generated using a fusing agent printed onto a layer of build material, or all the objects may be generated using some other common additive manufacturing process). In other examples, all the objects may be generated using a particular class of apparatus (for example, a powder and fusing agent based 3D printing system). In some examples, all the objects may be generated using the same instance of an additive manufacturing apparatus (i.e. a particular 3D printer).

Inference models may be developed by use of curve fitting, machine learning and/or artificial intelligence techniques. In some examples, the set of objects from which measurements are acquired for forming a training dataset may comprise at least 100 objects, and in other examples may be many times higher, for example comprise sat least 1000, or tens or hundreds of thousands of objects. An inference model based on a training dataset will generally improve with size, but the impact of additional samples reduces as the sample set grows large. In some examples, generating the inference model may comprise, for example, carrying out a data fitting and/or function approximation for data interpolation operations on the training dataset. For example, the inference model may be generated using curve fitting, in some examples using spline based data interpolation techniques, for example based on thin-plate splines. In other examples, other methods may be used, for example other polyharmonic data fitting techniques (for example other polyharmonic splines), data regression such as Support Vector Machine regression, smoothing techniques or the like. The inference model may be realised as an algorithm, a look-up table, a neural network with programmed weights or may be represented in some other way.

In other examples, the mapping resource(s) may be developed based on theoretical or measured models of behaviour such as thermal behaviour and/or material behaviour modelling predicted deviations from intended object dimensions in additive manufacturing.

In some examples, there may be a plurality of mapping resources, which may relate to different object generation parameter values. The parameter(s) may be any parameter which may have an impact on dimensional inaccuracy. For example, the parameter(s) may comprise any, or any combination of, environmental conditions, object generation apparatus, object generation material composition, object cooling profile or print mode. These may be specified, for example, by input to at least one processor.

A specification of the environmental conditions may, for example, comprise providing any, or any combination of, an indication of the environmental temperature, humidity, air pressure or the like. It has been noted that varying the environmental conditions can result in different dimensional inaccuracies being seen in generated objects.

A specification of the object generation material composition may comprise any, or any combination of, a specification of a choice of build material and/or print agent, a source or batch of object generation material to be used, a proportion of fresh to recycled build material or the like. Such factors may also impact the dimensional inaccuracies seen in generated objects.

Cooling profiles may also impact dimensional inaccuracies. For some build material types, relatively slow cooling profiles may have less of an impact on dimensional accuracy than faster cooling profiles, which may be more likely to cause a change (or a greater change) in object dimensions.

The choice of print mode (for example, draft/prototype/fast or detailed/slow) may also have an effect on dimensional inaccuracy, with draft, prototype or fast modes tending to be associated with greater dimensional inaccuracy than detailed or slower operational modes.

Figure 4:
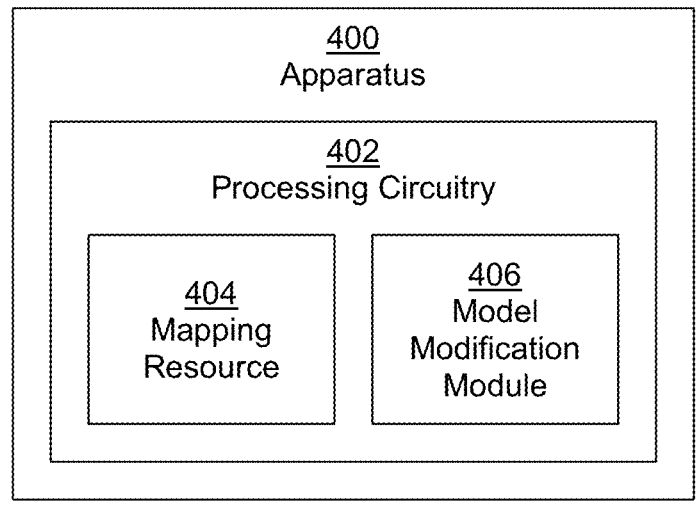
FIGS. 4 and 5 are simplified schematic drawings of example apparatus for additive manufacturing.

FIG. 4 shows an apparatus 400 comprising processing circuitry 402. The processing circuitry 402 comprises a mapping resource 404 and a model modification module 406.

The mapping resource 404 associates parametrical transformations to compensate for object deformation in additive manufacturing to object placement locations within a fabrication chamber. The locations may be described by coordinates in one or more axis. In one example, the mapping resource represents at least one multidimensional (e.g. 3D) grid of values ('nodes') with locations within a fabrication chamber. In one example, the mapping resource comprises a set of parametrical transformation values associated with distributed spatial locations within a fabrication chamber. In some examples, for at least one set of parametrical transformation values, the distributed spatial locations are evenly distributed in space in at least on dimension. The parametrical transformation values may comprise geometrical transformation values, for example scale and/or offset values. In some examples, the mapping resource 404 may be stored as data in a memory or memory resource(s) (for example, a machine readable medium) of the apparatus 400.

The model modification module 406, in use of the apparatus 400, determines at least one parametrical transformation for object model data describing an object to be generated using additive manufacturing from the mapping resource based on the object's intended placement location within a fabrication chamber and modifies the object model data using the parametrical transformation. In some examples, the model modification module 406 determines the at least one parametrical transformation for an object to be generated using additive manufacturing from the mapping resource using interpolation, as has been described above.

Figure 5:
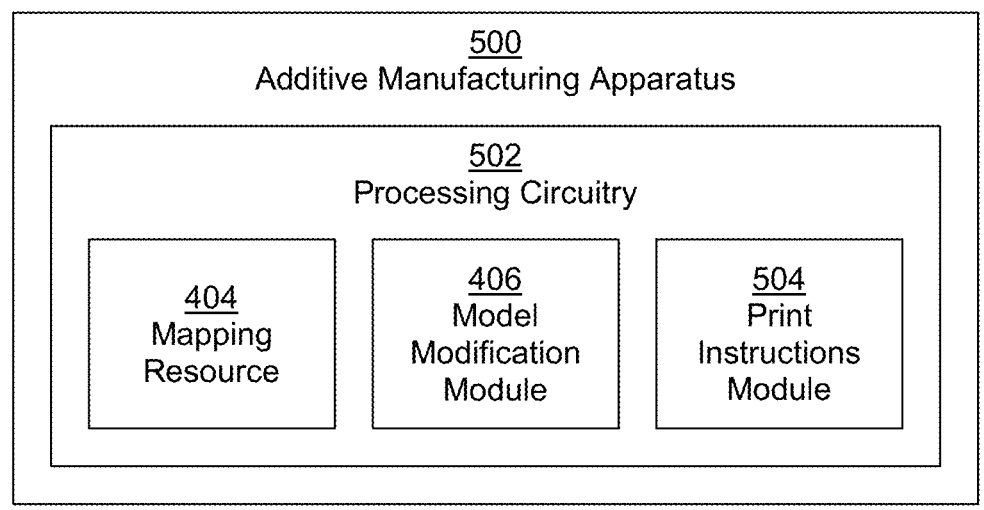

FIG. 5 shows additive manufacturing apparatus 500 to generate an object comprising processing circuitry 502. The processing circuitry 502 comprises the mapping resource 404, which is stored in a memory thereof, and the model modification module 406 of FIG. 5 and further comprises a print instructions module 504.

The additive manufacturing apparatus 500, in use thereof, generates the object in a plurality of layers (which may correspond to respective slices of an object model) according to control data. The additive manufacturing apparatus 500 may for example generate an object in a layer-wise manner by selectively solidifying portions of layers of build materials. The selective solidification may in some examples be achieved by selectively applying print agents, for example through use of 'inkjet' liquid distribution technologies, and applying energy, for example heat, to the layer. The additive manufacturing apparatus 500 may comprise additional components not shown herein, for example any or any combination of a fabrication chamber, a print bed, printhead(s) for distributing print agents, a build material distribution system for providing layers of build material, energy sources such as heat lamps and the like.

The control data (for example comprising object generation instructions and/or pint instructions) in this example is generated by the print instructions module 504. The generated control data may, in use thereof, control the additive manufacturing apparatus 500 to generate each of a plurality of layers of the object. This may for example comprise specifying area coverage(s) for print agents such as fusing agents, colorants, detailing agents and the like. In some examples, object generation parameters are associated with object model sub-volumes. In some examples, other parameters, such as any, or any combination of heating temperatures, build material choices, an intent of the print mode, and the like, may be specified. In some examples, halftoning may be applied to determined object generation parameters to determine where to place fusing agent or the like. The control data may be specified in association with sub-volumes. In some examples, the control data comprises a print agent amount associated with sub-volumes.

The processing circuitry 402, 502 or the modules thereof may carry out any of the blocks of FIG. 1, or any of block 302 to 310 of FIG. 3.

Figure 6:
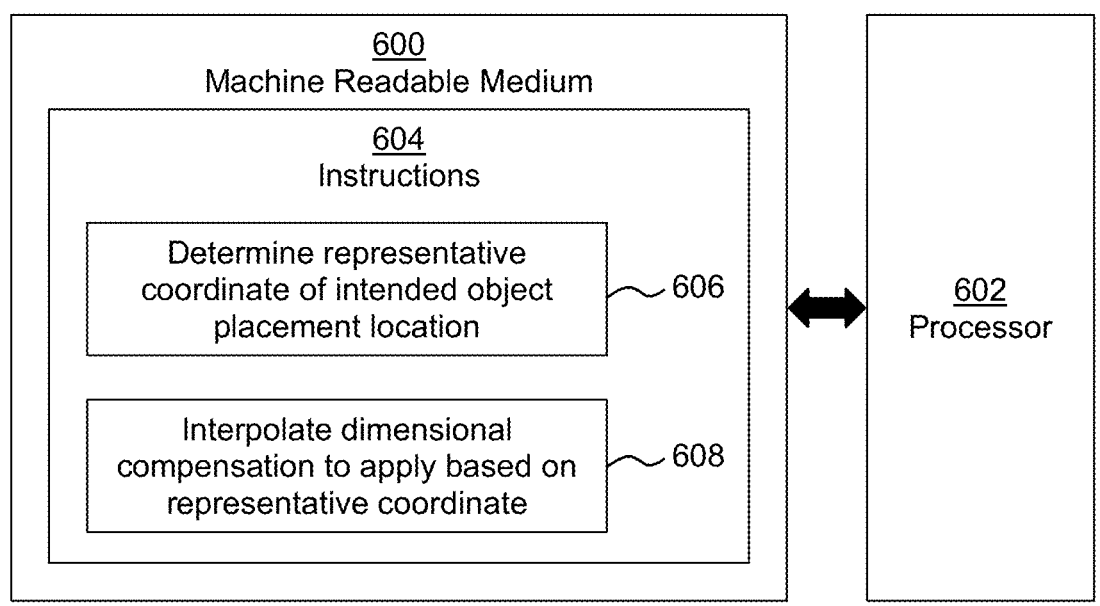
FIG. 6 is a simplified schematic drawing of an example machine-readable medium associated with a processor.

FIG. 6 shows a tangible machine-readable medium 600 associated with a processor 602. The machine-readable medium 600 comprises instructions 604 which, when executed by the processor 602, cause the processor 602 to carry out tasks. In this example, the instructions 604 comprise instructions 606 to cause the processor 602 to determine a representative coordinate of an intended placement location of an object within a fabrication chamber and instructions 608 to cause the processor 602 to interpolate a dimensional compensation to apply to object model data representing the object based on the representative coordinate using a look-up resource associating dimensional compensations with each of a plurality of locations in the fabrication chamber. The look-up resource may comprise data stored in the machine-readable medium 600, or may be stored in a separate memory resource. The representative coordinate may relate to at least one direction, for example at least one of an x, y or z axis.

In some examples, the instructions 604 comprise instructions which when executed cause the processor 602 to apply the interpolated dimensional compensation to a data model representing the object.

In some examples, the instructions when executed cause the processor 602 to carry out any of the blocks of FIG. 1 or any of block 302 to 310 of FIG. 3. In some examples, the instructions may cause the processor 602 to act as any part of the processing circuitry 502 of FIG. 5 or FIG. 6.

Examples in the present disclosure can be provided as methods, systems or machine-readable instructions, such as any combination of software, hardware, firmware or the like. Such machine-readable instructions may be included on a computer readable storage medium (including but not limited to disc storage, CD-ROM, optical storage, etc.) having computer readable program codes therein or thereon.

The present disclosure is described with reference to flow charts and/or block diagrams of the method, devices and systems according to examples of the present disclosure. Although the flow diagrams described above show a specific order of execution, the order of execution may differ from that which is depicted. Blocks described in relation to one flow chart may be combined with those of another flow chart. It shall be understood that each block in the flow charts and/or block diagrams, as well as combinations of the blocks in the flow charts and/or block diagrams can be realized by machine-readable instructions.

The machine-readable instructions may, for example, be executed by a general-purpose computer, a special purpose computer, an embedded processor or processors of other programmable data processing devices to realize the functions described in the description and diagrams. In particular, a processor or processing apparatus may execute the machine-readable instructions. Thus, functional modules of the apparatus (such as the mapping resource 404, the model modification module 406 and/or the print instructions module 504) may be implemented by a processor executing machine-readable instructions stored in a memory, or a processor operating in accordance with instructions embedded in logic circuitry. The term 'processor' is to be interpreted broadly to include a CPU, processing unit, ASIC, logic unit, or programmable gate array etc. The methods and functional modules may all be performed by a single processor or divided amongst several processors.

Such machine-readable instructions may also be stored in a computer readable storage that can guide the computer or other programmable data processing devices to operate in a specific mode.

Machine-readable instructions may also be loaded onto a computer or other programmable data processing devices, so that the computer or other programmable data processing devices perform a series of operations to produce computer-implemented processing, thus the instructions executed on the computer or other programmable devices realize functions specified by flow(s) in the flow charts and/or block(s) in the block diagrams.

Further, the teachings herein may be implemented in the form of a computer software product, the computer software product being stored in a storage medium and comprising a plurality of instructions for making a computer device implement the methods recited in the examples of the present disclosure.

While the method, apparatus and related aspects have been described with reference to certain examples, various modifications, changes, omissions, and substitutions can be made without departing from the spirit of the present disclosure. It is intended, therefore, that the method, apparatus and related aspects be limited by the scope of the following claims and their equivalents. It should be noted that the above-mentioned examples illustrate rather than limit what is described herein, and that those skilled in the art will be able to design many alternative implementations without departing from the scope of the appended claims. Features described in relation to one example may be combined with features of another example.

The word "comprising" does not exclude the presence of elements other than those listed in a claim, "a" or "an" does not exclude a plurality, and a single processor or other unit may fulfil the functions of several units recited in the claims.

The features of any dependent claim may be combined with the features of any of the independent claims or other dependent claims.

The invention claimed is:

1. A method of dimensional compensation in additive manufacturing comprising:
   receiving object model data representing an object with intended dimensions to be generated in a fabrication chamber by a thermal fusing process in which heat is applied to layers of build material to selectively solidify portions of the layers of build material;

determining an object location within the chamber where the object is to be generated;

applying a dimensional compensation to the object model data that is determined based on thermal conditions within the chamber at the object location, the dimensional compensation to compensate for anticipated departures from the intended dimensions induced by applying the heat during the thermal fusing process;

determining object generation instructions for generating the object according to the dimensionally compensated object model data; and, generating the object based on the object generation instructions.

2. A method as in claim 1, further comprising:

determining the dimensional compensation through a mapping resource that relates dimensional compensations to object locations within the chamber.

3. A method as in claim 1, wherein determining the object location within the chamber where the object is to be generated comprises:

designating within the chamber, an origin of an X, Y, and Z coordinate system; and, using X, Y, and Z offsets from the designated origin to specify the object location.

4. A method as in claim 3, further comprising characterizing the object location as a point location with coordinates selected from, coordinates of the center of mass of the object when generated, coordinates of the volumetric center of the object when generated, coordinates of a point on the object closest to the designated origin, and coordinates that refer to a volume enclosing the object.

5. A method as in claim 1, wherein the dimensional compensation specifies at least one of a scaling factor and an offset factor.

6. A method as in claim 5, wherein the dimensional compensation comprises three scaling factors and three offset factors, and each of the three scaling factors and the three offset factors is associated with one of three orthogonal axes.

7. A method as in claim 1, wherein the object generation instructions specify an amount of print agent to be applied to each of a plurality of locations on a layer of build material.

8. A method as in claim 1, wherein selectively solidifying portions of the layers of build material comprises selectively printing the layers of build material with energy absorbing liquid fusing agent.

9. A non-transitory machine-readable medium comprising instructions which when executed by a processor cause the processor to:

determine a representative coordinate of an intended placement location for an object within a fabrication chamber; and, interpolate a dimensional compensation to apply to object model data representing the object based on the representative coordinate, wherein the dimensional compensation compensates for an anticipated departure from an intended dimension that occurs during generation of the object by a thermal fusing process, and wherein the dimensional compensation is determined based on thermal conditions of the fabrication chamber at the intended placement location.

10. A non-transitory machine-readable medium as in claim 9, wherein the instructions when executed further cause the processor to interpolate the dimensional compensation by accessing a look-up resource that associates dimensional compensations with each of a plurality of locations in the fabrication chamber.

11. A non-transitory machine-readable medium as in claim 9, wherein the instructions when executed further cause the processor to apply the interpolated dimensional compensation to the object model data representing the object.

* * * * *